US010529515B2

(12) United States Patent
Navarro et al.

(10) Patent No.: US 10,529,515 B2
(45) Date of Patent: Jan. 7, 2020

(54) SWITCH INCLUDING A PHASE CHANGE MATERIALS BASED STRUCTURE WHERE ONLY ONE PART IS ACTIVATABLE (71) Applicant: Commissariat A L'Energie Atomique et aux Energies Alternatives, Paris (FR)

(72) Inventors: Gabriele Navarro, Grenoble (FR); Damien Saint-Patrice, Chabeuil (FR); Alexandre Leon, Sassenage (FR); Vincent Puyal, Grenoble (FR); Bruno Reig, Moirans (FR)

(73) Assignee: Commissariat A L'Energie Atomique et aux Energies Alternatives, Paris (FR)

(*) Notice: Subject to any disclaimer, the term of this patent is extended or adjusted under 35 U.S.C. 154(b) by 0 days.

(21) Appl. No.: 15/636,815

(22) Filed: Aug. 4, 2017

(65) Prior Publication Data

US 2018/0005786 A1 Jan. 4, 2018

(30) Foreign Application Priority Data

Jul. 4, 2016 (FR) ...................................... 16 56363

(51) Int. Cl.
*H01H 37/34* (2006.01)
*H01P 1/12* (2006.01)
(Continued)

(52) U.S. Cl.
CPC ............. *H01H 37/34* (2013.01); *H01P 1/127* (2013.01); *H01P 1/184* (2013.01); *H01H 37/72* (2013.01); *H01L 45/06* (2013.01)

(58) Field of Classification Search
CPC ........ H01H 37/34; H01H 37/72; H01L 45/06; H01P 1/127; H01P 1/184
(Continued)

(56) References Cited

U.S. PATENT DOCUMENTS 7,667,219 B2 * 2/2010 Chang ..................... H01L 45/06
257/2
2002/0175741 A1 * 11/2002 Sher ....................... H01L 23/525
327/525
(Continued)

FOREIGN PATENT DOCUMENTS

EP          2 706 582 A1     3/2014
WO    WO 2007/041431 A1     4/2007
WO    WO 2009/001262 A1    12/2008

OTHER PUBLICATIONS

French Preliminary Search Report dated Feb. 28, 2017 in French Application 16 56363, filed on Jul. 4, 2016 (with English translation of Categories of Cited Documents).
(Continued)

*Primary Examiner* — Jacob R Crum
(74) *Attorney, Agent, or Firm* — Oblon, McClelland, Maier & Neustadt, L.L.P.

(57) ABSTRACT

Selector switch provided with:
- a structure based on at least one phase change material placed between a first conducting element and a second conducting element, the phase change material being capable of changing state,
- means of heating the phase change material provided with at least one first heating electrode and at least one other heating electrode,
- the structure based on a phase change material being configured to form a confined active zone of the phase change material at a distance from the conducting elements.

19 Claims, 8 Drawing Sheets (51) Int. Cl.
*H01P 1/18* (2006.01)
*H01L 45/00* (2006.01)
*H01H 37/72* (2006.01)

(58) Field of Classification Search
USPC .......................................................... 337/298
See application file for complete search history.

(56) References Cited

U.S. PATENT DOCUMENTS

| | | | | |
|---|---|---|---|---|
| 2005/0174861 A1* | 8/2005 | Kim | ........................ | H01L 45/06 365/200 |
| 2007/0040159 A1* | 2/2007 | Wang | ...................... | H01L 45/06 257/3 |
| 2007/0126040 A1* | 6/2007 | Lung | ........................ | H01L 45/06 257/295 |
| 2010/0044664 A1* | 2/2010 | Liu | ...................... | H01L 27/2463 257/2 |
| 2010/0188892 A1* | 7/2010 | Baks | .................. | G11C 13/0004 365/163 |
| 2011/0186798 A1* | 8/2011 | Kwon | ...................... | H01L 45/06 257/2 |
| 2014/0070158 A1 | 3/2014 | Nodin et al. | | |
| 2014/0266517 A1 | 9/2014 | Werner et al. | | |
| 2014/0301137 A1* | 10/2014 | Kim | .................. | G11C 13/0004 365/163 |
| 2016/0035973 A1* | 2/2016 | Raieszadeh | ............. | H01L 45/06 257/4 |
| 2016/0079019 A1 | 3/2016 | Borodulin et al. | | |

OTHER PUBLICATIONS

Anand Gopinath et al. "Ga As FET RF Switches", IEEE transactions on Electron Devices, vol. ED-32, No. 7, 1985, 7 pages.

Aurelian Crunteanu et al. "Microwave Switching Functions Using Reversible Metal-Insulator transition (MIT) in $VO_2$ Thin Films", Proceedings of the 37$^{th}$ European Microwave Conference, 2007, 4 pages.

Arnaud Vena et al "A Fully Passive RF Switch Based on Nanometric Conductive Bridge", Proc. Int. MTT, 2012, 3 pages.

Yonghyun Shim et al "RF Switches Using Phase Change Materials", IEEE Int. COnf. Microelectromech. Syst, 2013, 4 pages.

Muzhi Wang et al. "Directly Heated Four-Terminal Phase Change Switches", Proc. IEEE MTT-S Int. Microw. Symp, 2014, 4 pages.

Stefan Lai "Current status of the phase change memory and its future", IEDM Tech. Dig, 2003, 4 pages.

U.S. Appl. No. 15/101,825, filed Jun. 3, 2016, 2017/0057809 A1, Damien Saint-Patrice et al.

U.S. Appl. No. 15/101,839, filed Jun. 3, 2016, 2016/0304338 A1, Damien Saint-Patrice et al.

U.S. Appl. No. 15/385,209, filed Dec. 20, 2016, Bruno Reig et al.
U.S. Appl. No. 15/444,629, filed Feb. 28, 2017, Bruno Reig et al.
U.S. Appl. No. 15/636,815, filed Jun. 29, 2017, Gabriele Navarro et al.

* cited by examiner

SWITCH INCLUDING A PHASE CHANGE MATERIALS BASED STRUCTURE WHERE ONLY ONE PART IS ACTIVATABLE

TECHNICAL DOMAIN AND PRIOR ART

This application relates to the field of selector switches integrating a phase change material, and particularly phase change materials made in thin layers that can form part of an integrated circuit or an electronic device. This invention is particularly applicable to RF selector switches, in other words to structures designed to reversibly modify electrical connections between the elements of an RF circuit.

RF selector switches are usually made from electronic components such as Field Effect Transistors (FET) or Positive Intrinsic Negative (PIN) diodes or using Micro Electro Mechanical System (MEMS) type electromechanical relays.

RF selector switches including a Phase Change Material (PCM) have also appeared.

The operation of an RF selector switch based on a PCM material is typically based on two states that this material can adopt:

- an amorphous state with high resistivity, that is considered like a blocked (OFF) state of the selector switch when transmission of an RF signal is prevented between at least two terminals,
- a crystalline state with low resistivity, that is considered like a conducting (ON) state of the selector switch when transmission of an RF signal is possible between at least two terminals.

Since the two states are stable, there is no need to maintain a current/voltage to maintain a state that can save power compared with other technologies such as selector switches based on FET or PIN diodes.

Moreover, a selector switch provided with a PCM material can route higher power signals than powers that are normally carried through MEMS selector switches.

Document US 2014/0266517 A1 discloses an example of an on-off switch with a PCM material inserted between an input conducting line and an output conducting line though which an RF signal will transit.

The phase change of the PCM material is obtained by passing a current pulse in dedicated electrodes in direct contact with the PCM material or at a distance from this material.

A direct heating mode is preferred to limit consumption of the selector switch, in other words heating is produced by the Joule effect using electrodes directly in contact with the PCM material.

Document US 2016/035973 A1 contains another example of a selector switch with PCM material.

The state change from the conducting state to the blocked state in such selector switches is made by modifying the state of the entire volume of the PCM material.

The problem that arises is to make a selector switch from PCM materials with better performances, particularly in terms of consumption and/or reliability.

PRESENTATION OF THE INVENTION

One embodiment of this invention relates to a selector switch capable of making or breaking a connection between at least one first conducting element and at least one second conducting element, the selector switch being formed on a support and comprising:

- a structure based on at least one phase change material located between the first conducting element and the second conducting element, the phase change material being capable of changing state between a crystalline state in which the phase change material has one resistivity and an amorphous state in which the phase change material has another resistivity higher than the first resistivity,
- means of heating the phase change material provided with at least one first electrode and at least one second electrode, the heating means being capable of changing the state of a given volume of the phase change material structure called the active zone and in particular putting the active zone into an amorphous state, the phase change material structure being configured such that the active zone is not in contact with the first conducting element and the second conducting element and is located between first volume of phase change material in a crystalline state in contact with the first conducting element and a second volume of phase change material in a crystalline state in contact with the second conducting element such that the active zone separates the first volume from the second volume and prevents a signal being routed between the first volume and the second volume, when the central volume forming the active zone is in the amorphous state. The state change of the active zone is reversible, such that when the active zone is in an amorphous state, it can be returned to a crystalline state.

In a selector switch according to the invention, the layout of the PCM material structure in relation to the conducting elements and the electrodes is organised such that the active zone does not occupy the entire volume of the PCM material structure and is localised and at a distance from conducting elements. Thus, the energy necessary for melting of the active zone can be minimised and the cooling rate can be increased to maintain the amorphous state. Confining the active zone and moving it to a distant from the conducting elements reduces the thermal power required to change the state of the PCM material. A remote active zone can result in a homogeneous PCM material in the active zone and prevent heterogeneous amorphous/crystalline interface zones in the PCM material at contact areas between the conducting elements and the PCM material structure. This means that the different blocked and conducting states of the selector switch can be better marked, in other words it can be made more reliable. This can also increase the lifetime of the selector switch.

According to another aspect, this invention relates to a selector switch capable of making or breaking a connection between least one first conducting element and at least one second conducting element, the selector switch being formed on a support and comprising:

- a structure based on at least one phase change material placed between the first conducting element and the second conducting element,
- heating means of the phase change material provided with at least one first electrode and at least one second electrode, the heating means being capable of changing the state of a volume called the active zone of the phase change material structure, the phase change material structure being formed from at least one central region located between the first conducting element and the second conducting element and between the first electrode and the second electrode, the phase change material structure also being provided with a first zone called the "first branch", a second zone called the "second branch", a third zone called the "third branch" and a fourth zone called the "fourth branch", that are distinct and are distributed around the central region and extend such that the first branch is in contact with the first conducting element, the second branch is on contact with the second conducting element, the third branch is in contact with the first electrode and the fourth branch is in contact with the second electrode. Thus, the structure of the PCM material can advantageously be in the form of a cross. Such an arrangement of the PCM material structure enables confinement of the active zone and improves performances in terms of consumption, reliability and life of the selector switch.

The third branch preferably has a zone in contact with a central region of the PCM structure with a narrower section than in a zone in contact with the first electrode, to obtain an active zone with better confinement at the centre of the PCM structure.

Similarly, the fourth branch can have a zone in contact with the central region of the PCM structure with a narrower section than in a contact zone with the second electrode.

Advantageously, the widths of the third branch and the fourth branch are less than the widths of the first branch and the second branch. This facilitates creation of an active zone at a distance from the first conducting element and the second conducting element.

Advantageously, the first branch also has a narrower section in a zone in contact with the central region than in a zone in contact with the first conducting element.

Similarly, the second branch has a narrower section in a zone in contact with the central region than in a zone in contact with the second conducting element.

According to one possible embodiment of the PCM material structure, the shape of at least one of said branches becomes narrower as the distance from the central region reduces. This can improve the confinement of the active zone in a central region of the PCM structure.

A first isolating portion can be provided between the first branch and the fourth branch. A second isolating portion can also be provided between the fourth branch and the second branch. Similarly, a third isolating portion can also be provided between the second branch and the third branch. A fourth isolating portion can also be provided between the third branch and the first branch.

A selector switch can be provided in which the layout of the PCM structure is horizontal. In this case, the first branch, the second branch, the third branch and the fourth branch extend parallel to a principal plane of the support.

A selector switch can be provided in which the layout of the PCM structure is vertical, as a variant. In this case, the first branch and the second branch extend in a first plane, the third branch and the fourth branch extend in a second plane, the angle between the first plane and the second plane not being null, and the first plane and the second plane can be orthogonal.

According to one possible embodiment of the phase change material structure, this structure can be formed between the first electrode and the second electrode of a stack comprising a first layer based on a first phase change material, the first layer being located between a second layer and a third layer, the second layer and the third layer being based on at least one second phase change material different from the first phase change material.

The melting temperature of the first phase change material can be less than the melting temperature of the second phase change material and/or its thermal conductivity can be higher than the thermal conductivity of the second phase change material. Such an arrangement enables better confinement of the active zone at the first layer.

The phase change material structure can from a stack comprising a first layer of PCM material located between a second layer of PCM material a third layer based can a PCM material, the sections of the second layer of PCM material and/or the third layer of PCM material becoming narrower as the distances from the first electrode and the second electrode respectively increase and as the distance from the first layer PCM material reduces. Such an arrangement also enables better confinement of the active zone at the first layer.

According to one possible embodiment of the phase change material structure, the structure can be formed between the first electrode and the second electrode of a stack comprising a first layer of PCM material located between a second layer of PCM material and a third layer of PCM material, the first layer of PCM material comprising a thinned portion located between a portion of the second layer of PCM material and a portion of the third layer of PCM material. Such an arrangement also enables better confinement of the active zone at the first layer.

Advantageously, the selector switch is an RF selector switch, capable of routing a RF signal interrupting routing of an RF signal between the first conducting element and the second conducting element.

According to another aspect, this invention relates to a switching system comprising a plurality of selector switches as defined above and arranged in parallel such that the first conducting elements of each of the selector switches are connected to each other and the second conducting elements of each of the selector switches are connected to each other.

A first embodiment of such a system includes a layout of the selector switches in which each of the first electrodes of the selector switches are connected to each other, and each of the second electrodes of the selector switches are connected to each other. Thus, the electrodes of the heating means are put in parallel.

The first electrodes of the selector switches are then connected to a first biasing means, while the second electrodes of the selector switches are connected to each other and to a second biasing means.

A second embodiment of such system includes a layout of the selector switches in which the first electrode of a first selector switch is connected to a first biasing means, the second electrode of the first selector switch being connected to the first electrode of a following selector switch, and the second electrode of a last selector switch is connected to a second biasing means. Thus, the electrodes of the heating means are put in series.

The first biasing means can be a current generator and the second biasing means can also be a current generator. In particular, the first biasing means can be a current generator configured to send current pulses, for example in the form of notches. The second biasing means can for example be an alternating current generator.

BRIEF DESCRIPTION OF THE DRAWINGS

This invention will be better understood after reading the description of example embodiments given purely for information and that are in no way limitative, with reference to the appended drawings on which.

Furthermore, in the following description, terms that depend on the orientation of the device such as "horizontal" and "vertical" should understood assuming that the structure is oriented as shown on the figures.

Identical, similar or equivalent parts of the different figures have the same numeric references to facilitate the comparison between the different figures.

The different parts shown on the figures are not necessarily all at the same scale, to make the figures more easily understandable.

DETAILED PRESENTATION OF PARTICULAR EMBODIMENTS

Figure 1:
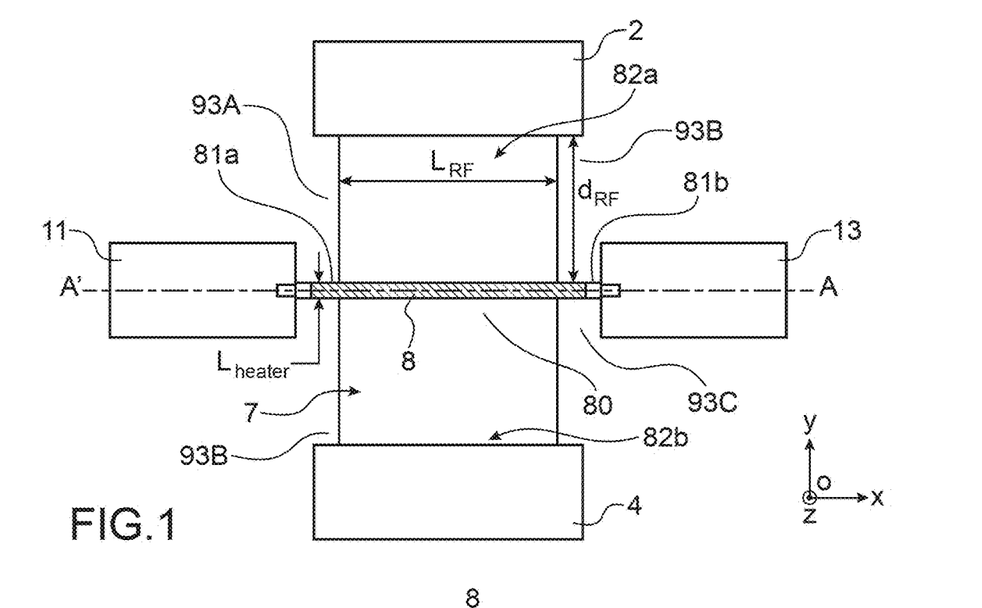
FIG. 1 illustrates a top view of an example of an RF selector switch or an RF on-off switch provided with at least one integrated PCM material.

One example of a selector switch according to one embodiment of this invention will be now be described with reference to FIG. 1 showing a top view.

This selector switch can be used to modify the connections of at least one circuit (not shown) that in this example embodiment will be used to transport radiofrequency (RF) signals. The selector switch is thus an RF selector switch capable of routing or interrupting, routing of an RF signal between a first portion of a circuit and a second portion of a circuit, depending on the state of at least one phase change material (PCM) formed between these two portions. The device described herein can perform the function of a bistable on-off switch. Nevertheless, the term "selector switch" will be used throughout this detailed presentation. The RF signal is transported at a frequency that can for example be between several Megahertz and several hundred Gigahertz and has a power for example of the order of 40 dBm.

The selector switch thus behaves like a first conducting element 2 through which at least one RF signal will be input and that is connected with the first portion (not shown) of the RF circuit and a second conducting element 4 connected with the second portion (not shown) of the RF circuit and through which the RF signal will be output. The conducting elements 2, 4 are for example based on a metallic material such as gold (Au) and are in the form of pads with a thickness for example of the order of 1 µm.

The first conducting element 2 and the second conducting element 4 thus form two terminations of a RF electric signal transmission, these two terminations being separated from each other by a structure based on at least one phase change material 7 and being electrically connected to this structure, and advantageously in contact with it.

The selector switch can be put into a first state called the "conducting" state in which the first conducting element 2 and the second conducting element 4 are connected to each other such that at least one RF signal can transit from the first conducting element 2 to the second conducting element 4. The selector switch can also adopt a second state called the "blocked" state in which transmission of an RF signal between the first conducting element 2 and the second conducting element 4 is prevented.

The "conducting" and "blocked" states of the selector switch correspond to different states of a volume or a zone 8 of the phase change material 7 called the "active zone". In particular, the phase change material 7 can be a material capable of changing from an amorphous state to a crystalline state and vice versa as a function of its temperature. Thus, the active zone 8 of the phase change material 7 located between the conducting elements 2, 4 can be in a high resistivity state when the material 7 is in amorphous form, or a low resistivity state when the material 7 is in crystalline form. "Low resistivity" means resistivity equal for example to between $10^{-4}$ ohm·cm and $10^{-2}$ ohm·cm. "High resistivity" means a resistivity equal for example to between 10 ohm·cm and 1000 ohm·cm.

When the phase change material 7 in the active zone 8 is in its crystalline state with low resistivity, the RF signal is transmitted from the first conducting element 2 to the second conducting element 4, whereas when the phase change material 7 in the active zone 8 is in its amorphous state with high resistivity, the RF signal is reflected and therefore is not transmitted to the second conducting element 4.

Therefore, an on-off switch function can be obtained by changing the state of the material 7 between its amorphous state and its crystalline state.

For example, the phase change material 7 can be based on a chalcogenide or an alloy of chalcogenides for example based on germanium and tellurium such as GeTe or based on germanium, tellurium and antimony ($Ge_xSb_yTe_z$). Such materials advantageously have a high ratio of resistivities, for example of the order of $10^3$ and that can be as high as $10^6$ between their low resistivity state and the high resistivity state. The thickness (dimension measured parallel to the z axis of the [O; x; y; z] orthogonal coordinate system) of the phase change material 7 may for example be of the order of 100 nm.

The device is provided with means of activating the PCM phase change material to change it from an amorphous state to a crystalline state and vice versa, these means preferably being electrical heating means. A direct heating means configured to inject an electrical activation signal is used herein. The activation signal is typically in the form of a current injected into the PCM material 7 that is then heated by the Joule effect. The direct heating means is equipped with electrodes 11, 13 in contact with the PCM material 7 and between which this structure is located.

When an appropriate current pulse passes between two electrodes 11 and 13 through the PCM material 7, the active zone 8 of this material changes from a crystalline state to an amorphous state with high resistance. The active zone 8 is then configured so as to block the passage of an RF signal between the first conducting element 2 and the second conducting element 4.

Another appropriate current pulse is applied between the two electrodes 11, 13 to change the PCM material 7 in the active zone 8 from its amorphous state to its crystalline state.

The intensity of the current pulse can be between several hundred micro-amperes and several tens of mA depending on the quantity of the PCM material.

For example, current pulses of the order of 1 mA with a duration of the order of 10 μs may be used to achieve crystallisation, while current pulses to achieve amorphisation are higher, for example of the order of 10 mA with a shorter duration, for example of the order of 50 ns.

The electrodes 11, 13 of the direct heating means are dissociated from the conducting elements 2, 4 through which the RF signal passes. The electrodes 11, 13 can be in the form of studs for example with a thickness of the order of 1 μm and based on a conducting material different from that used for the conducting elements 2, 4, for example such as TiN.

In the selector switch used according to the invention, the volume of the active zone 8 (cross-hatched zone on FIG. 1) that will change state is not the entire volume of the phase change, material 7. All that is modified is the state of a given volume of the phase change material, and remaining volumes of the phase change material for which the state is not modified are kept around the active zone.

Thus, when the selector switch is in a blocked state in which the signal is prevented from transiting between the first conducting element and the second conducting element, only the active zone 8 is transformed to its amorphous state while the remaining volumes of the phase change material 7 located on each side of the active zone 8 are in crystalline form. In device of this type, the electrodes 11, 13 are moved to a distance from the active zone 8 that can change state to reduce the power necessary for the state change. An active zone shifted in this manner can limit consumption of the selector switch. The fact that the active zone is confined in a given volume, particularly located in a central region of the phase change material structure also makes it possible to make the state (amorphous or crystalline) more homogeneous and thus increase the reliability of the selector switch and improve its performances in terms of speed.

For a given intensity of the activation current injected into the first heating electrode, the layout of the active zone 8 depends particularly on the layout of the phase change material structure 7, particularly relative to the electrodes 11, 13 and the conducting elements 2, 4.

In the example in FIG. 1, the phase change material is distributed in the form of a central region 80 and distinct branches 81a, 81b, 82a, 82b distributed around this central region 80, with branches extending from the central region to the first electrode 11, the second electrode 13, the first conducting element 2 and the second conducting element 4, respectively.

The central region 80 and branches 81a, 81b form a first block located between the conducting elements 2 and 4, while the central region 80 and the branches 82a, 82b form a second block between the electrodes 11, 13, and crosses or overlaps the first block. In this particular example embodiment, the first block is orthogonal to the second block, the branches 81a, 81b, 82a, 82 thus extending in different regions.

The central region 80 and the branches 81a, 81b, 82a, 82b thus form a configuration in the form of a cross, the ends of which are in contact with the first electrode 11, the first conducting element 2, the second conducting element 13 and the second electrode 4, respectively. The branches 81a, 81b, 82a, 82b are not connected to each other and can be separated in pairs by an insulating region located around the phase change material. This insulating material, for example in the form of at least one dielectric material, comprises a portion 93A located between the branch 81a connected to the first electrode 11 and the branch 82a connected to the first conducting element 2. There is an insulating portion 8S2 between the branch 82a connected to the first conducting element 2 and the branch 81b connected to the second electrode 13. There is another insulating portion 93C between the branch 81b connected to the second electrode 13 and the branch 82b connected to the second conducting element 4. There is another insulating portion 93D between the branch 82b connected to the second conducting element 4 and the branch 81a connected to the first electrode 11.

In this example, the branches 81a, 81b are orthogonal to the branches 82a, 82b.

Figure 2:
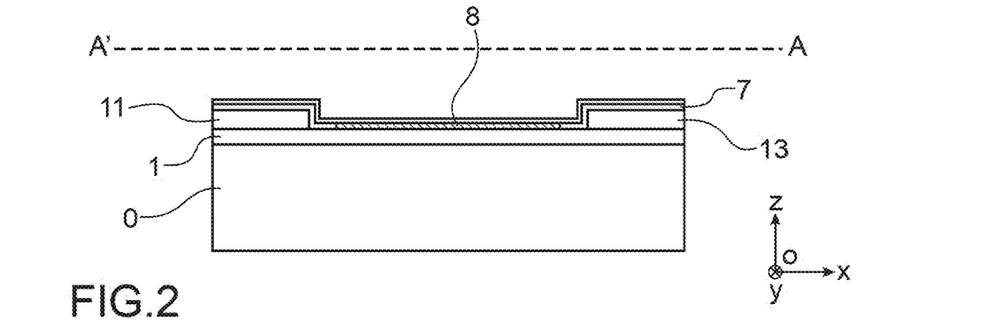
FIG. 2 contains a sectional view the selector switch.

The support on which the branches 81a, 81b, 82a, 82b are formed may be a semiconducting substrate 0 as illustrated diagrammatically on FIG. 2 showing a cross-sectional view on A'A.

The semiconducting substrate 0 may for example by made of silicon and passivated by an insulating layer 1 based for example on $SiO_2$ on which the structure of the PCM material is deposited. The PCM material 8 in this case is distributed in a layer that extends on and in contact with the electrodes 11, 13.

Preferably, the branches 81a, 81b are directed towards the electrodes 11, 13 with a width $L_{heater}$ less than the width $L_{RF}$ of the branches 82a, 82b, directed towards the conducting elements 2, 4. The widths $L_{heater}$ and $L_{RF}$ are dimensions of the phase change material structure measured parallel to the principal plane of the support, i.e. a plane parallel to the [O; x; y] plane.

A dimension $d_{RF}$ of the branch 82a or 82b measured along an axis parallel to the axis along which the branch 82a or 82b extends is defined between one end of a branch 82a, 82b and a lateral edge of one of the branches 81a, 81b. This dimension $d_{RF}$ in this case is a distance between a conducting element 2 or 4 and the central region 80 of the phase change material structure.

The performances of the selector switch in terms of activation current and voltage are optimised by adapting the widths $L_{heater}$ and $L_{RF}$ and the dimension $d_{RF}$. The width $L_{RF}$ of the branches 82a, 82b could for example be between 10 nm and 100 μm, and the width $L_{heater}$ of the branches 81a, 81b could for example be between 10 nm and 1 μm, and the dimension $d_{RF}$ could for example be between 100 nm and 10 μm. Advantageously, the width $L_{RF}$ is of the order of 1 000 nm, while the width $L_{heater}$ is of the order of 400 nm. In this case, the dimension $d_{RF}$ can be of the order of 500 nm. With such dimensions and a phase change material structure based on GeTe of the order of 100 nm thick, a selector switch can be created with resistances $R_{ON}$ in the conducting state and $R_{OFF}$ in the blocked state of the phase change material structure equal to 20 Ohm and $2 > 10^6$ Ohm for an activation voltage of the order of 20 V and an activation current of 20 mA respectively.

Figure 3A:
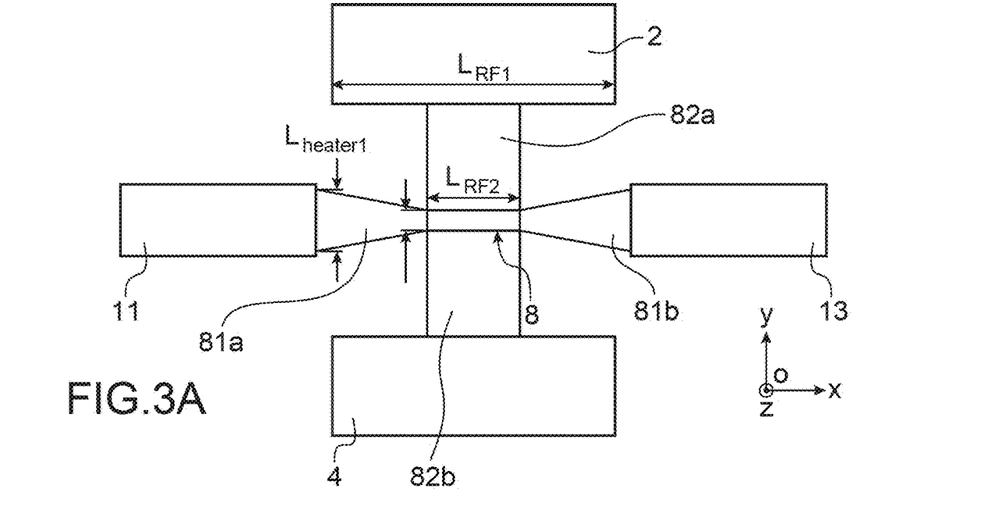
FIGS. 3A and 3B contain example embodiments of a selector switch with a PCM material structure used according to the invention with branches distributed around a central region, the width of the branches increasing with increasing distance from the central region and with reducing distance from the heating electrodes.

FIG. 3A shows an improved configuration of the phase change material structure 7.

This structure is different from the structure described above in that the branches 81a, 81b in contact with electrode 11 and electrode 13 respectively are narrower close to the central region 80 than close to the periphery of the phase change material structure, in other words at the electrodes 11, 13 and the conducting elements 2, 4.

FIG. 3A shows a particular embodiment of the narrowing achieved. The branches 81a, 81b in contact have a variable cross-section that in particular varies linearly. A cross-section is a section taken in a plane orthogonal to the principal plane of a support on which the selector switch is located. The "principal plane" of the support means a plane passing through the support and that is parallel to the [O; x; y] plane of the [O; x; y; z] orthogonal coordinate system given on FIG. 1.

With such a layout, a section of the PCM structure at the central region or the active PCM zone taken orthogonally to the direction of the heating current circulating between the electrodes 11, 12 is less than the surface area of a zone of PCM material in contact with the heating electrodes 11, 12 for the PCM structure taken orthogonally to the direction of the heating current.

This narrowed shape of the branches 81a, 81b at the central region of the phase change material structure further concentrates the active zone 8 in the central region 80 of the phase change material structure.

Localising the active zone at the centre of the structure and preventing the possibility of phases changing at heating electrodes contact zones, thus eliminates a problem of high electricity consumption and a reduction in the reliability of the selector switch in the long term. In particular, this prevents a degradation of the PCM structure in the zone in contact with the electrodes 11, 13.

Thus, the widths $L_{heater1}$ of the branches 81a, 81b in a contact zone with electrodes 11, 13 respectively are more than the width $L_{heater2}$ close to the central region 80 of the phase change material structure. The branches 81a, 81b could be narrowed such that $L_{heater1}$-$L_{heater2}$ is equal to at least 30 nm, and for example of the order of 100 nm.

Advantageously, the branches 82a, 82b could also have a narrowed shape.

Figure 3B:
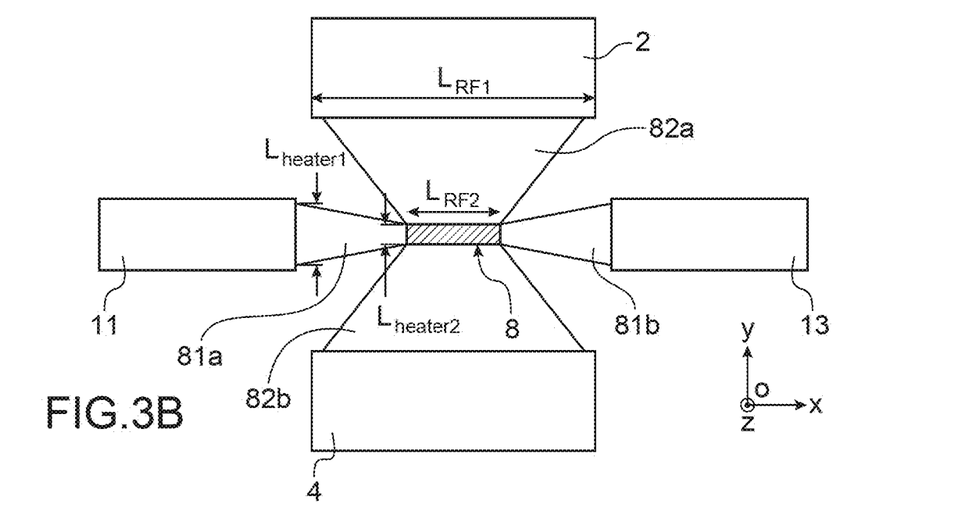

FIG. 3B thus shows another improved configuration of the phase change material structure 7.

This structure is different from the structure described above in that the branches 82a, 82b in contact with the conducting element 2 and conducting element 4 respectively are narrower close to the central region 80 than close to the periphery of the phase change material structure, in other words at the conducting elements 2, 4.

The confinement effect of the active zone at the centre of the PCM structure is thus increased.

FIG. 3B shows an example embodiment in which the cross-section of the branches 82a, 82b varies linearly.

Similarly and advantageously, the widths $L_{RF1}$ of the branches 82a, 82b in a contact zone with conducting elements 2, 4 respectively can be more than the width $L_{RF2}$ close to the central region 80 of the phase change material structure. The branches 82a, 82b could also be narrowed such that $L_{RF1}$-$L_{RF2}$ is equal to at least 30 nm, and for example is of the order of 100 nm.

A narrowed form of only one of the branches 81a 81b and/or 82a, 82b could also be envisaged, but a narrowed shape is preferably used for each of the branches. This makes it possible to better concentrate the active zone 8 in the central region 80 of the phase change material structure.

Figure 4:
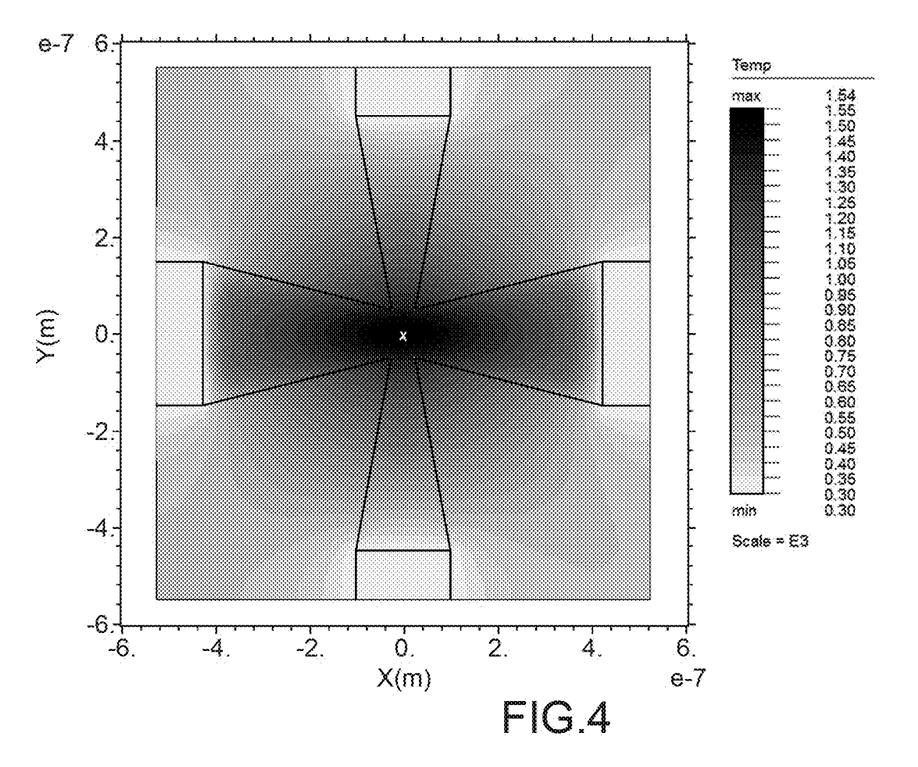
FIG. 4 shows a map of the temperature rise of the selector switch in FIG. 3 obtained by simulation.

This is confirmed by a simulation result illustrated on FIG. 4 that contains a heating map of the phase change material structure of the selector switch described above with reference to FIG. 3B. For example, such a map can be obtained using a simulation and digital analysis tool using the finite elements method for example as used in the FlexPDE software.

The active zone 8 of the selector switch is preferably wide enough to interrupt the RF signal but narrow enough to limit the consumption.

Preferably, a shape of the branches 81a, 81b is chosen such that the volume of the active zone 8 is equal to not more than ⅓ of the total volume occupied by the branches 81a, 81b.

For example, the shape of the branches is chosen, such that the proportions between the volume of a portion of branch 81a for which the state does not change, the volume of a portion of branch 81b for which the state does not change, and the volume of the active zone 8 that can change state, are for example of the order of ⅓, ⅓, ⅓ respectively.

In the example embodiments described above, the heating means are arranged horizontally with electrodes 11, 13 in the same plane, approximately or exactly parallel to the principal plane of the support/substrate.

Figure 5A:
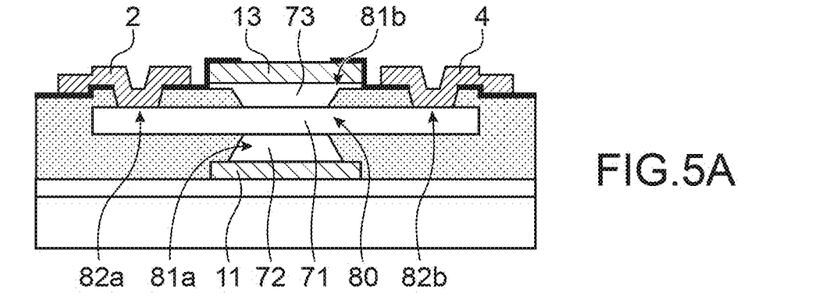
FIGS. 5A and 5B illustrate a variant embodiment of a selector switch comprising a PCM material structure in the form of a cross with branches extending horizontally and branches extending vertically.

FIG. 5A illustrates a variant embodiment with a vertical distribution of the heating means, the electrodes 11, 13 being located in the same plane making a non-null angle with the principal plane of the support, while the conducting elements 2, 4 are located in the same plane parallel to the principal plane of the support. The dimensions of the selector switch in a plane parallel to the support are thus reduced.

In this example, the phase change material structure is formed from a stack of several layers 71, 72, 73 of phase change material, for example GeTe, distributed in a central region 80, and around the central region 80 of peripheral branches 81a, 81b, 82a, 82b to which the electrodes 81a, 81b and conducting elements 82a, 82b respectively are connected.

In this example, the branches 82a, 82b connected to the conducting elements 2, 4 respectively extend in a first plane, and are composed of a first layer 71 of the stack, while the branches 81a, 81b connected to the electrodes 11, 13, are formed from a second layer 72 and a third layer 73 of the stack respectively, contained in a second plane not parallel to the first plane and particularly orthogonal to the first plane. The cross structure of the phase change material is surrounded by an insulating material 93, for example formed from one or several layers of Sin.

It can be seen on this figure that the section of the branches 81a, 81b connected to the electrodes 11, 13 are larger in a zone in contact with the electrodes 11, 13 than in a zone in contact with or close to the central region 80 of the PCM structure.

Figure 5B:
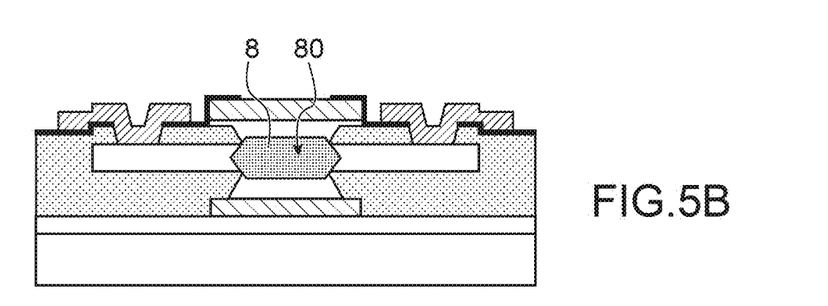

FIG. 5B illustrates the location of the active zone 8 in such a structure, Once again, the active zone 8, in other words the zone of PCM material likely to change state only accounts for part of the total volume of PCM material distributed between electrodes 11, 13 and between conducting elements 2, 4. The active zone in this example is confined to the central region 80 of PCM material structure and does not extend to the ends of the branches 81a, 81b, 82a, 82b. The central region 80 between the branches can change from a crystalline state to an amorphous state and vice versa, while the ends of the branches 81a, 81b, 82a, 82b remain in a crystalline state.

Figure 6A:
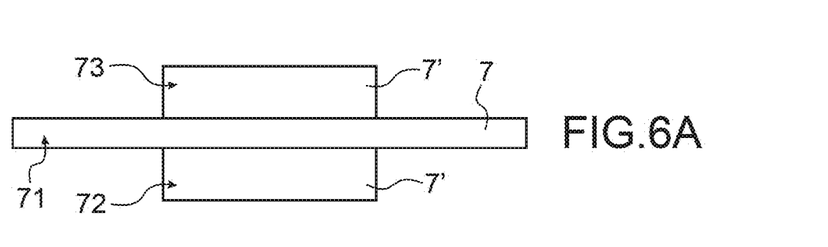
FIG. 6A illustrates a PCM material structure for a selector switch with a stack of layers of phase change material advantageously with different melting temperatures and/or different thermal conductivities.
Figure 6B:
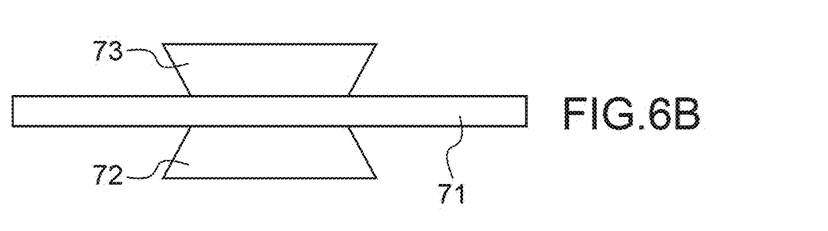
FIG. 6B illustrates a PCM material structure for a selector switch with stack of layers of phase change materials with width decreasing with decreasing distance from the centre of the structure.
Figure 6C:
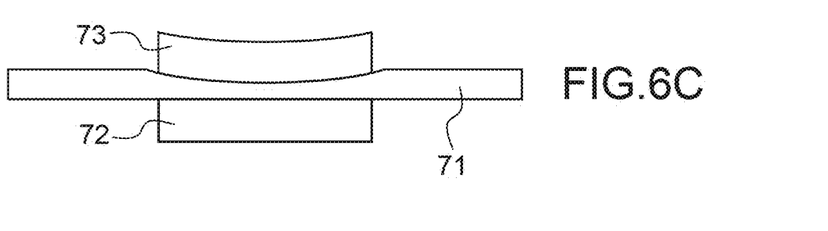
FIG. 6C illustrates a PCM material structure for a selector switch with a stack of layers of phase change materials, one of the layers having thinner part at its centre than at its periphery.

FIGS. 6A, 6B, 6C illustrate variants of stacks of layers of phase change materials that can be integrated into the selector switch, and particularly that in FIGS. 5A, 5B. Advantageously, these can be layers of different natures.

In the stack shown in FIG. 6A, the first layer 71 of PCM material in which the active zone 8 can be made is based on a phase change material with a first melting temperature, while the second layer 72 and the third layer 73 located under and on the first layer 71 are based on a phase change material with a second melting temperature, higher than the first melting temperature.

A structure with regions, particularly in the form of stacked layers of PCM materials with different melting temperatures and/or thermal conductivities can be provided, in order to improve confinement of the active zone in the PCM material structure.

For example, the first layer 71 can be made of $Ge_{50}Te_{50}$ with a melting temperature of the order of 750° C. and the second and third layers 72, 73 can be made of $Ge_{70}Te_{30}$ with a melting temperature of the order of 900° C. In an embodiment of this type, by placing the layer 71 between two material layers with a higher melting temperature, a better confinement of the active zone is obtained, that can be located principally in a portion of the first layer 71 located between and in contact with the second and third layers 72, 73 of phase change material.

As a variant, layer 71 can be formed with higher thermal conductivity than the second layer 72 of PCM material and the third layer of PCM material. An example stack is formed for example using a first layer 71 made of $Ge_{50}Te_{50}$ located between two layers based on a PCM material with lower thermal conductivity, for example $Ge_2Sb_2Te_5$.

Another example stack illustrated on FIG. 6B includes layers 72, 73 with a larger contact are with heating electrodes 11, 13 larger than the contact area with the first layer of phase change material. The shape of the layers 72, 73 becomes narrower with increasing distance from heating electrodes and with reducing distance from the zone of the first layer 71 forming the central region of the PCM material structure in which the active zone will be majority distributed.

In the example stack in FIG. 6C, the first layer 81 located between the second and third layers 72, 73 comprises a thinned part located between and in contact with the second and third layers 72, 73. In this example, this part of the first layer 71 thinner than its edges forms the central region the PCM material structure in which the active zone will be majority distributed. The result obtained is thus a narrowed section as described above become narrower with decreasing distance from a central region of the PCM structure and with increasing distance from the electrodes and/or conducting elements.

Another example embodiment comprises layers 71, 72 or 73 with, as shown on FIG. 6B, a variable section along a vertical plane (in other words a plane parallel to the [O,x,z] plane), the first layer 71 having a cross shape as shown on FIG. 3, wing towards the centre of the stack.

A selector switch according to any one of the example embodiments described above can be included in a selector switch system including several selector switches in parallel. Such a system can possibly include one or several selector switches arranged vertically as illustrated on FIGS. 5A-5B and one or several selector switches arranged horizontally as illustrated on FIG. 1 or 3.

Figure 7:
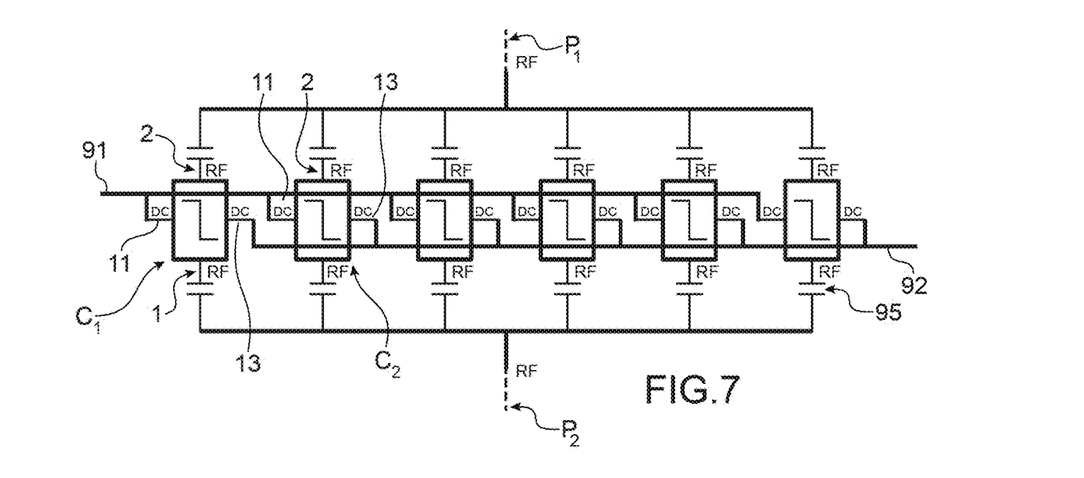
FIG. 7 illustrates a switching device comprising a plurality of selector switches based on a PCM material put in parallel, the heating electrodes being arranged in parallel.

An example embodiment of a system with selector switches connected in parallel is given on FIG. 7.

Therefore, in this case at least one RF signal is routed between a first portion P1 of a circuit and a second portion P2 of a circuit, or routing of this RF signal is interrupted, using a plurality of selector switches $C_1, C_2, \ldots, C_k$ (where k is equal to 7 in the example illustrated). Selector switches $C_1, \ldots, C_7$ are arranged in parallel such that the first conducting elements 2 of each are connected to each other while the second conducting elements 2 of each are connected to each other. In the example in FIG. 7, the selector switches $C_1, C_2, \ldots, C_k$ are arranged such that the first heating electrodes 11 of each of the selector switches are connected to each other and to a first biasing line 91 while the second heating electrodes 13 of each of the selector switches are also connected to each other and to a second biasing line 92.

One advantage of such a solution system is that a low DC control voltage Vax is applied to the biasing lines 91, 92 and this voltage Vax is equal to the threshold voltage $V_{TH}$ also called the changeover voltage of a single selector switch. The threshold voltage $V_{TH}$ depends on the thickness of the PCM material structure at the active zone. For example, the threshold voltage for an active zone with a thickness of the order of 100 nm, can be of the order of 1V.

Figure 8:
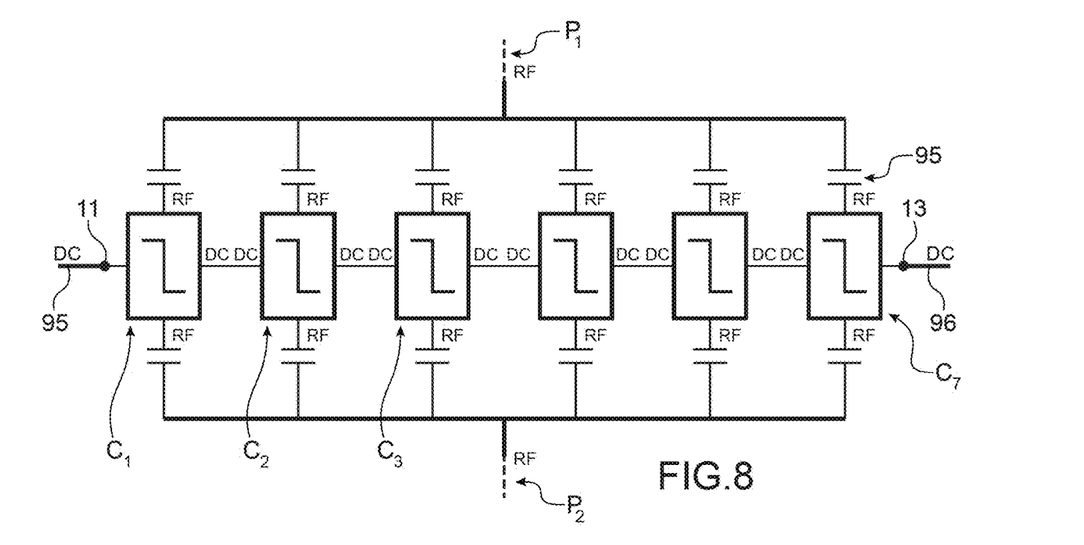
FIG. 8 illustrates a switching device comprising a plurality of selector switches based on PCM material pact in parallel, the heating electrodes being arranged in series.

FIG. 8 illustrates a variant of a system of selector switches comprising several selector switches C1, . . . , C7 in parallel. This example configuration is different from the previous configuration in that the heating electrodes 11, 13 in this case are arranged in series such that a first heating electrode of a switch C2 is connected to the second electrode 13 of a previous selector switch C1, while the second heating electrode 13 of the selector switch C2 is connected to the first electrode 11 of a next selector switch C3.

In this case, biasing means are provided to apply a DC voltage between the first electrode 11 of a first selector switch C1 located at one end 95 of the set of selector switches C1, . . . , C7 and the second electrode 13 of another selector switch C7 located at another end 96 of the set of selector switches C1, . . . , C7 put in parallel. Such a configuration can result in a DC control current (IDC-TOT) equivalent to that of a single selector switch and a better transition from a blocked state (OFF) to a conducting state (ON) due to better uniformity between the corresponding temperature profiles of the different selector switches. For example, in the case in which the selector switch system is composed of several selector switches of the type shown on FIG. 1, this individual device will be put in parallel. For k selector switches in parallel, the resistance $R_{ON}$ in the conducting state and the resistance $R_{OFF}$ are divided by k, out changing the activation voltages and currents of a single selector switch. In this case with selector switches in parallel, the chosen dimensions can be $L_{RF}$ example equal to k*1 000 nm, $d_{RF}$ for example of the order of 500 nm and $L_{heater}$ for example of the order of 400 nm.

A decoupling capacitor 95 is preferably included between the first conducting element 2 in each selector switch and the first circuit portion P1 and between the first conducting element 4 in each selector switch and the second circuit portion P2, in each of the systems of selector switches in parallel described above.

One example of a method of fabrication of a selector switch as described above will now be given with reference to FIGS. 9A-9C (illustrating a top view of the device during fabrication), FIGS. 10A-10C. (illustrating cross-sectional view along line A'A of the device during fabrication).

In this case the initial support is a substrate 100 that can be semiconducting and for example could be made of silicon. The substrate is typically passivated by an insulating passivated layer 101, for example based silicon dioxide ($SiO_2$) with a thickness for example of the order of 500 nm.

The first step is to make the heating means on this support in the form of electrodes 111, 113. The electrodes are made by deposition for example of the PVD (Physical Vapour deposition) type, following by photolithography and etching stack of conducting materials, for example a layer of Ti with thickness of the or of 10 nm on which there is a layer of TiN, for example of the order of 40 nm, a layer of AlCu for example of the order of 440 nm, a layer of Ti for example of the order of 10 nm, and a layer TiN for example of the order 100 nm.

In this particular example embodiment the conducting elements 102, 104 of the selector switch on which a signal will transit are formed in the same layer or the same stack as the activation or heating electrodes 111, 113 of the phase change material.

Figures 9A, 10A:
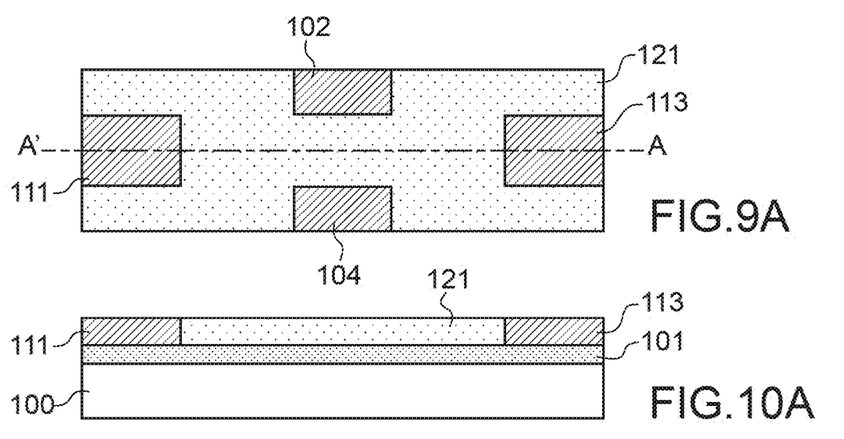
FIGS. 9A-9C, 10A-10C illustrate an example method of fabrication of a selector switch with a phase change material structure with branches distributed in a horizontal plane.

The next step is to deposit a layer of insulating material 121, for example made of $SiO_2$ with a thickness for example of the order of 300 nm to form insulation around the electrodes 111, 113 and conducting elements 102, 104 (FIGS. 9A and 10A).

The insulating material 121 may need to cover the electrodes 111, 113 and conducting elements 102, 104. In this case, Chemical Mechanical Polishing/Planarization (CMP) is used to expose the top face of the electrodes 111, 113 and conducting elements 102, 104.

Figure 9B:
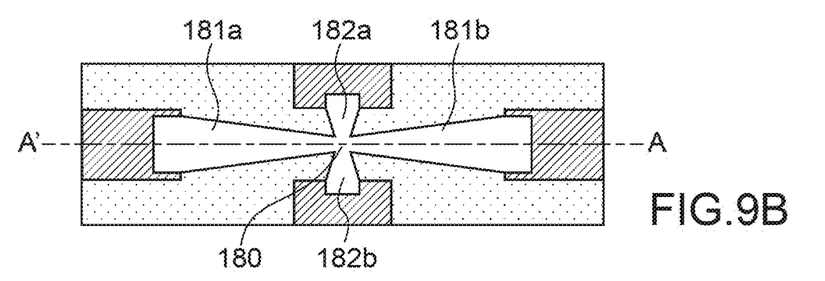
Figure 10B:
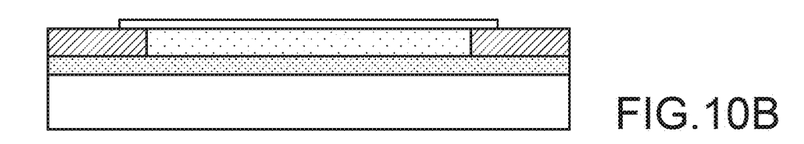
Figure 10C:
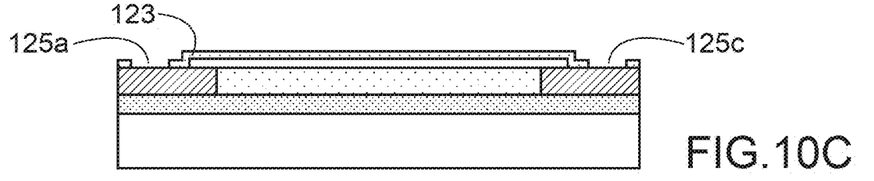

The phase change material structure 7 is then formed by deposition of a layer, for example made of GeTe, typically with a thickness of the order of 100 nm, in which at least one cross-shaped pattern is made (FIGS. 9B and 10B).

The pattern created can be of the type described above with reference to FIG. 1 or FIG. 3 and comprises a central region around which distinct branches 181a, 182a, 181b, 182b are distributed in contact with a first electrode 111, a first conducting element 102, a second electrode 113 and a second conducting element 104 respectively. The structure of the layer of phase change material 7 is typically made by IBE (Ion Beam Etching) through a resin mask.

Figure 9C:
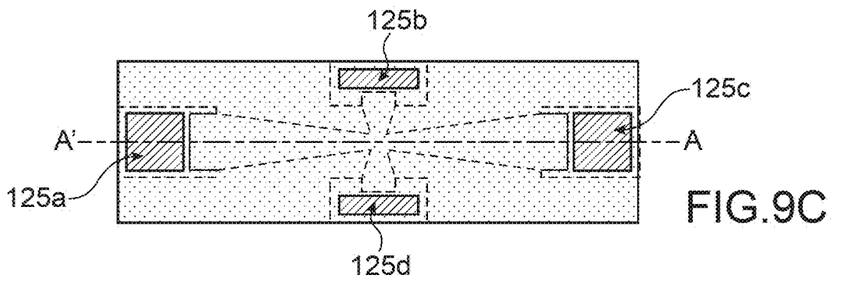

An insulating layer 123 is then formed to passivate the PCM material structure 7, for example based on SiN and of the order of 200 nm thick. Distinct openings 125a, 125b, 125c, 125d are formed in this insulating layer 123, exposing the first electrode 111, the first conducting element 102, the second electrode 113 and the second conducting element 104 respectively. Contacts can thus be made on the electrodes 111, 113 and conducting elements 102, 104 (FIGS. 9C and 10C).

In the example method described above, the selector switch made is of the type with a horizontal arrangement of the phase change material structure and with electrodes and conducting elements distributed around this structure.

Another example method of making a selector switch in which one of the branches of the phase change material structures extends vertically will now be described with reference to FIGS. 11A-11M.

Figure 11A:
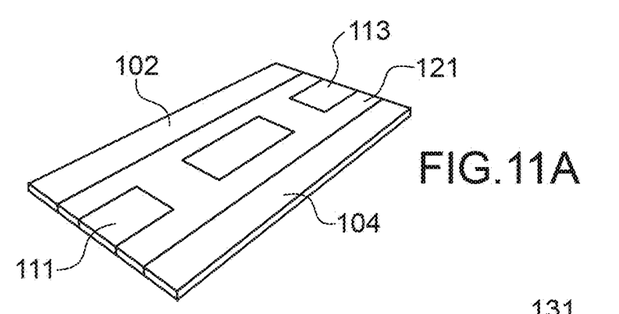
FIGS. 11A-11M illustrate another example method of fabrication of a selector switch with a phase change material structure with branches distributed in a horizontal plane and branches distributed in a vertical plane.
Figure 11B:
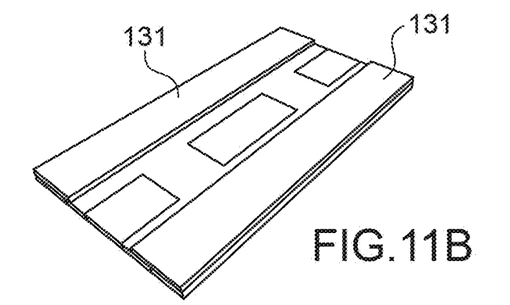

The first step is to make the control electrodes 111, 113 to heat the phase change and conducting elements 102, 104 for transmission or blocking of the RF signal.

The electrodes 111, 113 and conducting elements 104 can for example be made from the same stack as that used in the example method given previously, i.e. a 10 nm thick layer of Ti covered by a 40 nm layer of TiN covered by a layer of AlCu for example of the order of 440 nm, itself covered by a layer of Ti for example of the order of 10 nm, itself covered by a layer of TiN, for example of the order of 100 nm. A layer of insulating material 121 is then formed around the conducting elements and the electrodes (FIG. 11A).

Strips 131 of dielectric material of the capacitors are then formed extending on conducting elements 102, 104 (FIG. 11B) to make the RF decoupling capacitors connected to the conducting elements. The dielectric material used may for example be based on $SiO_2$, or SiN or $Al_2O_3$ with a thickness that depends on the value of the required capacitance, with a value typically between 10 nm and 1 μm.

The next step is to deposit a layer of phase charge material 172, for example based on GeTe with a thickness for example of the order of 100 nm that is structured for example by Ion as Beam Etching (IBE) using an ion beam, protecting some parts by hard mask zones 132. The hard mask zones 132 are for example made of silicon nitride (SiN) with a thickness for example equal to 150 nm. Etching is done so as to form blocks 172a of phase change material. The shape of the blocks 172a is widened, in this case with a surface area at the base larger than at the summit (FIG. 11C).

Figure 11C:
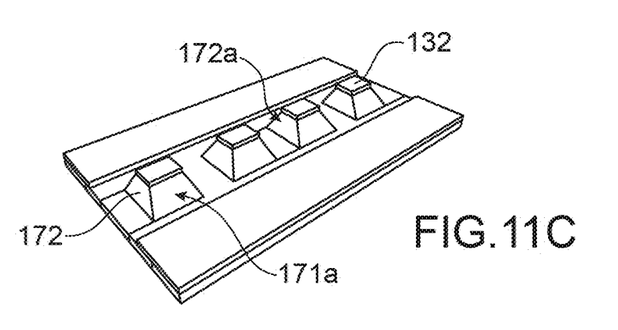

In the example embodiment in FIG. 11C, the blocks 172a of PCM material can be in the shape of a truncated pyramid. These blocks thus have a narrowed section at the central region of the PCM structure so that the active zone can be confined in this central ion of the structure.

Figure 11D:
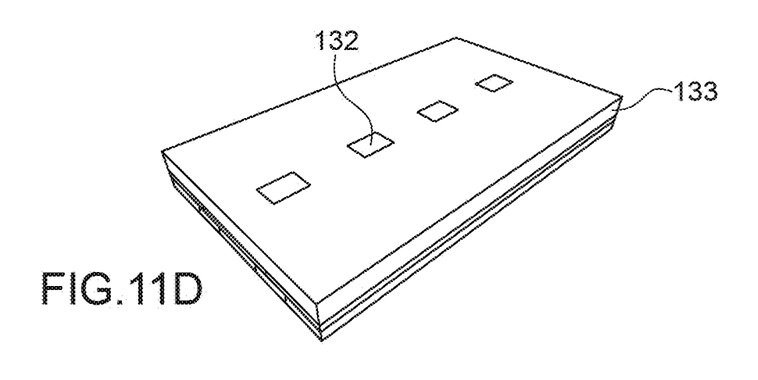

At least one insulating layer 133 is then formed so as to encapsulate and passivate the blocks 172a of PCM material. The insulating layer 133 may for example be made from a stack of dielectric materials comprising a layer based on Sin with a thickness for example of the order of 100 nm coated with another layer based on $SiO_2$ and with a thickness of the order of 300 nm. CMP planarisation of the stack of dielectric materials is then done so as to expose the hard mask zones 132 again (FIG. 11D).

Figure 11E:
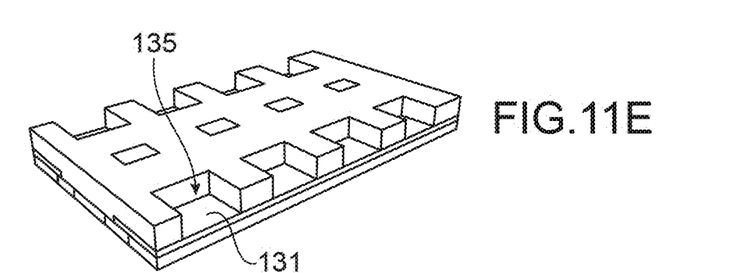

Openings 135 are then made in the insulating layer 133, exposing strips 131 of dielectric material of the RF decoupling capacitors (FIG. 11E).

These openings 135 are then filled with at least one conducting material 137 so as to form an armature for RF decoupling capacitors. For example, the conducting material 137 may be a metallic material for example such as AlCu with a thickness of the order of 300 nm.

Figure 11F:
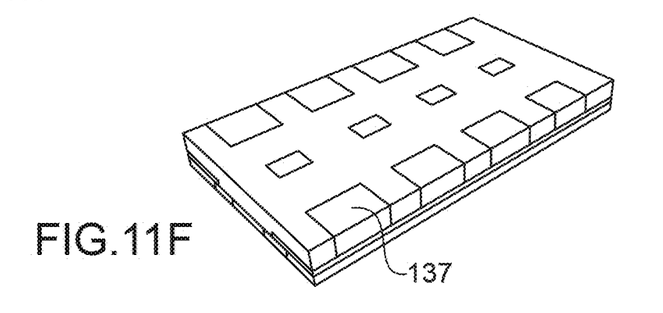

When this material spreads over the mouth of the openings 135 and covers the insulating layer 133, a CMP planarisation is made of the conducting material 137 so as to expose the top face of this insulating layer 133.

Figure 11G:
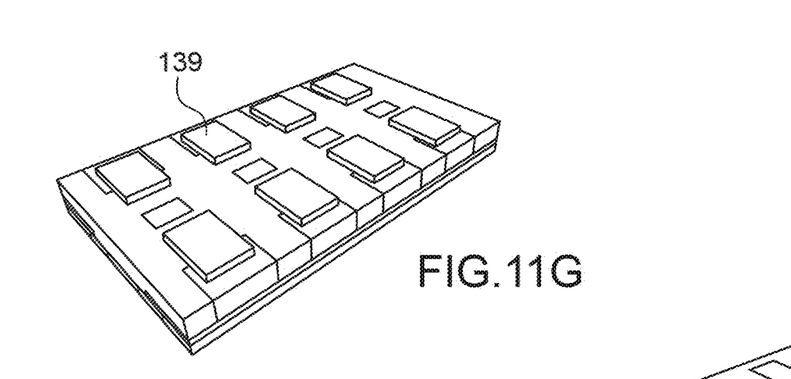

Conducting pads 139 are then made on and in contact with the upper armatures of the decoupling capacitors (FIG. 11G). The conducting pads 139 can for example be made from a stack of Ti for example 10 nm thick covered by a layer of TiN for example 40 nm thick covered by a layer of AlCu for example 440 nm thick, itself covered by a layer of Ti for example 10 nm thick, itself covered by a layer of TiN, for example 100 nm thick. The contacts 139 are typically formed by PVD deposition and then etching.

Figure 11H:
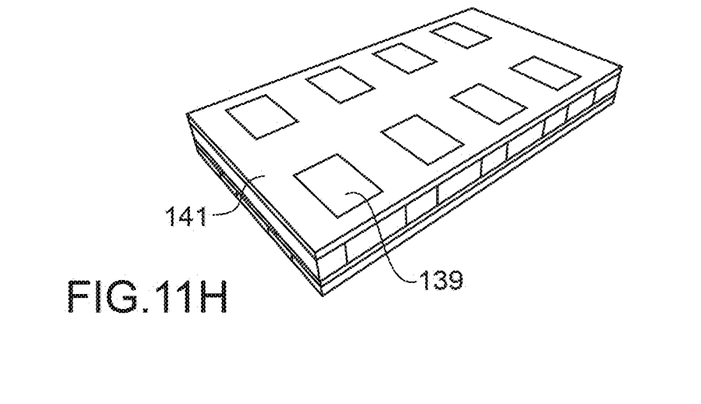

The conducting pads 139 are then made by deposition of at least one layer of dielectric material 141 for example such as SiN or $SiO_2$ with a thickness for example of the order of 450 nm. CMP planarisation can then be done so as to remove a portion of dielectric material 141 and once again expose the upper face of the conducting pads 139.

Figure 11I:
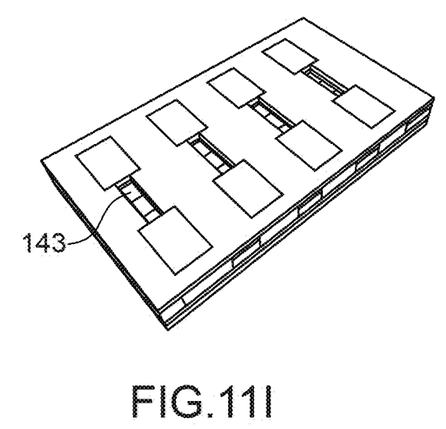

Openings 143 between conducting pads 139 are then formed. The openings 143 are made so as to expose the blocks 172a of the layer of phase change material 172 (FIG. 11I). Another layer 171 of phase change material is then formed in the openings 143. This other layer 171 may for example be based on GeTe with a thickness of the order of 300 nm. CMP polishing and possibly an overthickness of another layer 171 of phase change material can then be made so as to once again expose the conducting pads 139 and the encapsulation dielectric.

Advantageously, overetching can be done to reduce the layer 171 of phase change material, particularly at the centre of the pattern located between the conducting pads 139.

This can locate the active zone more precisely in the phase change materials structure.

Figure 11J:
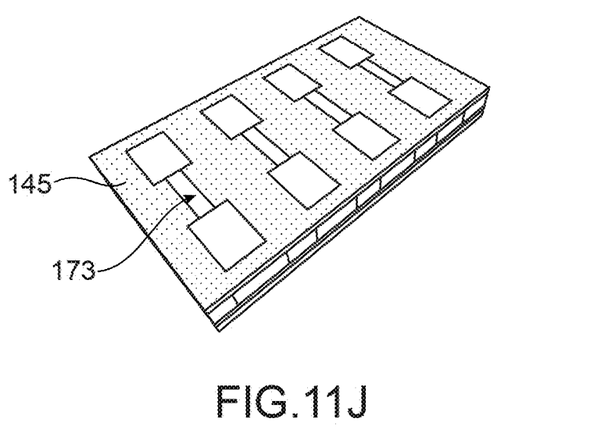

Another insulating encapsulation layer 145 is then made based on a dielectric material for example such as SiN or SiO$_2$ with a thickness for example of the order of 100 nm.

Figure 11K:
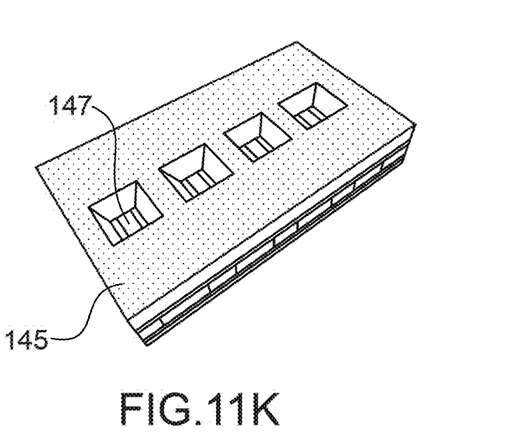

Openings 147 are made in this insulating encapsulation layer 145. The openings 147 expose the layer 173 of phase change material.

In this example, the openings 147 have a bottom a section taken parallel to the principal plane of the substrate 100 that is smaller than a section taken parallel to the principal plane of the substrate 100 of the mouth of the openings 147. In this example, the openings 147 are in the form of a truncated pyramid, the base of which corresponds to the mouth and the summit of which corresponds to the bottom of the openings 147.

Figure 11L:
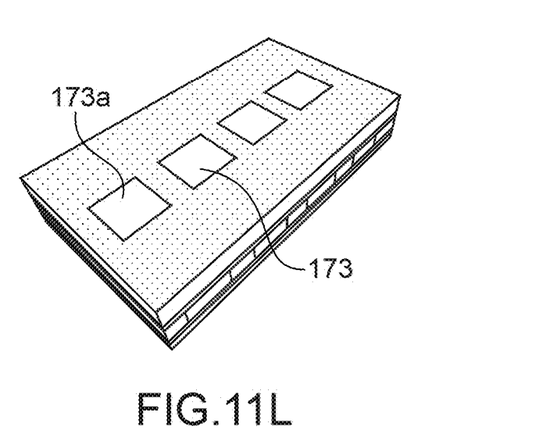

Another layer 173 of phase change material, for example such as GeTe with a thickness of 300 nm is then deposited in the openings 149. CMP polishing of an overthickness of the layer 173 of phase change material, if any, can then be made so as to once again expose the insulating encapsulation layer 145. The layer 173 the openings 147 makes blocks 173a of phase change material in the form of a truncated pyramid.

Figure 11M:
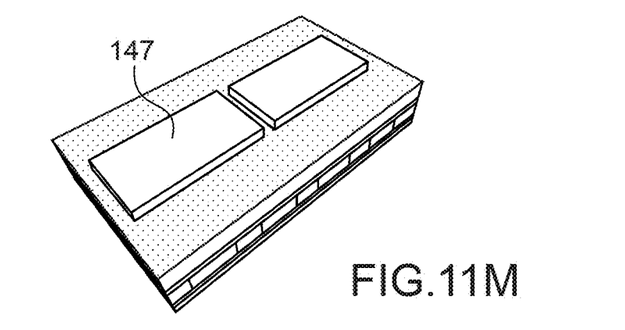

Contacts 147 are then made on the blocks 173a of phase change material, each contact 147 possibly being arranged on several blocks 173a of PCM material. The contacts 147 can then be formed by successive depositions so as to make a conducting stack for example comprising a Ti layer with a thickness for example of the order of 20 nm and an Au layer with a thickness for example of the order or 400 nm or a TiN layer with a thickness for example of the order of 100 nm.

The invention claimed is:

1. A selector switch capable of making or breaking a connection between at least one first conducting element and at least one second conducting element, comprising the following, on a support:
    a structure based on at least one phase change material located between the first conducting element and the second conducting element, the phase change material being capable of changing state between a crystalline state wherein the phase change material has a first resistivity and an amorphous state wherein the phase change material has a second resistivity higher than the first resistivity,
    means of heating the phase change material provided with at least one first heating electrode and at least one second heating electrode,
    wherein the phase change material structure is formed from at least one central region located between the first conducting element and the second conducting element and between the first electrode and the second electrode, and
    wherein the phase change material structure is formed between the first electrode and the second electrode of a stack comprising a first layer of phase change material located between a second layer of phase change material and a third layer of a phase change material, the sections of the second layer of phase change material and the third layer of phase change material becoming narrower as the distances from the first electrode and the second electrode respectively increase and as the distance from the first layer of phase change material reduces.

2. The selector switch according to claim 1, the means of heating being capable of putting a central volume called the active zone of the phase change material structure into an amorphous state, the phase change material structure being configured such that the central volume is not in contact with the first conducting element and the second conducting element and is located between a first volume of phase change material in a crystalline state in contact with the first conducting element and a second volume of phase change material in a crystalline state in contact with the second conducting element such that the central volume separates the first volume from the second volume and prevents a signal being routed between the first volume and the second volume, the central volume being smaller than or equal to ⅓ of the total accumulated volume including the first volume, the second volume and the central volume.

3. A device comprising at least one selector switch according to claim 1, the selector switch being an RF selector switch, capable of routing an RF signal or interrupting routing of an RF signal between the first conducting element and the second conducting element.

4. A switching system comprising a plurality of selector switches according to claim 1, the selector switches being arranged in parallel such that the first conducting elements of each of the selector switches are connected to each other and such that the second conducting elements of each of the selector switches are connected to each other.

5. A system comprising a plurality of selector switches according to claim 1, wherein:
    the first electrodes of the selector switches are connected to each other and to a first biasing means, the second electrodes of the selector switches being connected to each other and to a second biasing means;
    or wherein the first electrode of a first selector switch is connected to a first biasing means, the second electrode of the first selector switch being connected to the first electrode of a following selector switch, and the second electrode of a last selector switch is connected to a second biasing means.

6. The system according to claim 5, wherein the first biasing means is a current generator and the second biasing means is also a current generator.

7. The selector switch according to claim 1, the phase change material structure also being provided with a first branch, a second branch, a third branch and a fourth branch, that are distinct and that extend around the at least one central region, the first branch being in contact with the first conducting element, the second branch being in contact with the second conducting element, the third branch being in contact with the first electrode and the fourth branch being in contact with the second electrode,
    the third and/or the fourth branch(es) having a narrower section in a zone in contact with the central region than in a zone in contact with the electrode with which it is in contact.

8. The selector switch according to claim 7, the first branch and/or the second branch having a narrower section in a zone in contact with the at least one central region than in a zone in contact with the conducting element with which it is in contact.

9. The selector switch according to claim 7, in which a section of at least one of said branches becomes narrower as the distance from the at least one central region reduces.

10. The selector switch according to claim 7, widths of the third branch and the fourth branch being less than widths of the first branch and the second branch.

11. The selector switch according to claim 7, in which the first branch, the second branch, the third branch and the fourth branch extend parallel to a principal plane of the support.

12. The selector switch according to claim 7, wherein the first branch and the second branch extend in a first plane, the third branch and the fourth branch extend in a second plane, the angle between the first plane and the second plane being 90°.

13. A selector switch capable of making or breaking a connection between at least one first conducting element and at least one second conducting element, comprising the following, on a support:
 a structure based on at least one phase change material located between the first conducting element and the second conducting element, the phase change material being capable of changing state between a crystalline state wherein the phase change material has a first resistivity and an amorphous state wherein the phase change material has a second resistivity higher than the first resistivity,
 means of heating the phase change material provided with at least one first heating electrode and at least one second heating electrode,
 wherein the phase change material structure is formed from at least one central region located between the first conducting element and the second conducting element and between the first electrode and the second electrode, and
 wherein the first electrode and the second electrode are located in a plane orthogonal to the principal plane of the support, the phase change material structure is formed between the first electrode and the second electrode of a stack comprising a first layer of a first phase change material located between a second layer of phase change material and a third layer of phase change material, at least the first layer of phase change material comprising a thinned portion located between a portion of the second layer of phase change material and a portion of the third layer of phase change material.

14. The selector switch according to claim 13, the means of heating being capable of putting a central volume called the active zone of the phase change material structure into an amorphous state, the phase change material structure being configured such that the central volume is not in contact with the first conducting element and the second conducting element and is located between a first volume of phase change material in a crystalline state in contact with the first conducting element and a second volume of phase change material in a crystalline state in contact with the second conducting element such that the central volume separates the first volume from the second volume and prevents a signal being routed between the first volume and the second volume, the central volume being smaller than or equal to ⅓ of the total accumulated volume including the first volume, the second volume and the central volume.

15. A device comprising at least one selector switch according to claim 13, the selector switch being an RF selector switch, capable of routing an RF signal or interrupting routing of an RF signal between the first conducting element and the second conducting element.

16. A switching system comprising a plurality of selector switches according to claim 13, the selector switches being arranged in parallel such that the first conducting elements of each of the selector switches are connected to each other and such that the second conducting elements of each of the selector switches are connected to each other.

17. A system comprising a plurality of selector switches according to claim 13, wherein:
 the first electrodes of the selector switches are connected to each other and to a first biasing means, the second electrodes of the selector switches being connected to each other and to a second biasing means;
 or wherein the first electrode of a first selector switch is connected to a first biasing means, the second electrode of the first selector switch being connected to the first electrode of a following selector switch, and the second electrode of a last selector switch is connected to a second biasing means.

18. The system according to claim 17, wherein the first biasing means is a current generator and the second biasing means is also a current generator.

19. The selector switch according to claim 13, the phase change material structure also being provided with a first branch, a second branch, a third branch and a fourth branch, that are distinct and that extend around the at least one central region, the first branch being in contact with the first conducting element, the second branch being in contact with the second conducting element, the third branch being in contact with the first electrode and the fourth branch being in contact with the second electrode,
 the third and/or the fourth branch(es) having a narrower section in a zone in contact with the central region than in a zone in contact with the electrode with which it is in contact.

* * * * *

UNITED STATES PATENT AND TRADEMARK OFFICE
CERTIFICATE OF CORRECTION

| | | |
|---|---|---|
| PATENT NO. | : 10,529,515 B2 | Page 1 of 1 |
| APPLICATION NO. | : 15/636815 | |
| DATED | : January 7, 2020 | |
| INVENTOR(S) | : Gabriele Navarro et al. | |

It is certified that error appears in the above-identified patent and that said Letters Patent is hereby corrected as shown below:

On the Title Page

Item (22), the filing date is incorrect. Item (22) should read:
-- (22) Filed: June 29, 2017 --.

Signed and Sealed this
Seventh Day of April, 2020

Andrei Iancu
*Director of the United States Patent and Trademark Office*